US005639678A

United States Patent [19]
Lee et al.

[11] Patent Number: 5,639,678
[45] Date of Patent: Jun. 17, 1997

[54] METHOD OF MAKING SEMICONDUCTOR DEVICE WITH METAL SILICIDE NITRIDE LAYER AND METAL SILICIDE

[75] Inventors: Chang-Jae Lee; Chang-Reol Kim, both of Chungcheongbuk-do, Rep. of Korea

[73] Assignee: LG Semicon Co., Ltd., Cheongju, Rep. of Korea

[21] Appl. No.: 370,715

[22] Filed: Jan. 10, 1995

[30] Foreign Application Priority Data

Jan. 11, 1994 [KR] Rep. of Korea .................... 94-352

[51] Int. Cl.⁶ .................................................. H01L 21/8234
[52] U.S. Cl. ......................... 437/41; 437/190; 437/192; 437/200
[58] Field of Search ........................ 437/41 SM, 190, 437/192, 195, 200

[56] References Cited

U.S. PATENT DOCUMENTS

| | | | |
|---|---|---|---|
| 4,545,116 | 10/1985 | Lau | 29/591 |
| 4,855,798 | 8/1989 | Imamura et al. | 357/71 |
| 5,023,201 | 6/1991 | Stansolovich et al. | 437/192 |
| 5,312,774 | 5/1994 | Nakamura et al. | 437/192 |
| 5,434,044 | 7/1995 | Nulman et al. | 437/192 |

OTHER PUBLICATIONS

N.L Lee et al.; "Effect of the Silicidation Reaction Condition on the Gate Oxide Integrity in the Ti–Polycide Gate". Extended Abstracts of the 1993 Internation Conference on Solid State Devices and Materials, Makuhari, 1993; pp. 832–834, month unknown.

"Intermetallic Compound Formation/Kinetics"; p. 100–105, date unknown, author unknown.

Primary Examiner—John Niebling
Assistant Examiner—Richard A. Booth
Attorney, Agent, or Firm—Alan R. Loudermilk

[57] ABSTRACT

A MOSFET in accordance with this invention includes: a metal silicide layer formed on a impurity region and on the upper surface of a gate electrode; a metal silicide nitride layer formed on the metal silicide layer; and a metal nitride layer formed on the metal silicide nitride layer. The process for formation of a conductive layer includes the steps of: (a) forming an impurity region in a semiconductor substrate; (b) forming a metal layer on the impurity region; (c) carrying out a heat treatment under an inert gas atmosphere to form a metal silicide of metastable phase; and (d) carrying out a heat treatment under an nitrogen gas atmosphere so as for the metal silicide of the metastable phase to be phase-transited to a stable phase.

20 Claims, 3 Drawing Sheets

METHOD OF MAKING SEMICONDUCTOR DEVICE WITH METAL SILICIDE NITRIDE LAYER AND METAL SILICIDE

FIELD OF THE INVENTION

The present invention relates to a semiconductor device and a process for formation thereof, and more particularly to a process for formation of a silicide conductive layer which is suitable for formation of a high density MOS device.

BACKGROUND OF THE INVENTION

In accordance with the increase of the packing density of integrated circuits, the size of a unit cell has been reduced. Accordingly, the size of the gate line of the transistor in such a cell has been reduced, resulting in increased resistance and contact resistance.

In order to solve these problems, a technique has been developed for forming a metal silicide layer on a gate polysilicon electrode, and for forming a metal silicide layer on a contact portion of a silicon substrate. Consequently, the resistance of the gate electrode of the transistor and the contact resistance between the source and drain are reduced, thereby improving the device.

First, the formation of the metal silicide on the gate electrode and the formation of the metal silicide on the source/drain region were carried out as separate processes. However, in order to simplify the process and to reduce formation costs, there was developed a "salicide" technique (self aligned silicide formation technique) in which the gate and source/drain processes were carried out within the same process.

In this salicide method, a metal is coated on both the exposed silicon portion and on the insulator portion, and then a heat treatment is carried out. As a result, a silicidizing reaction occurs on the silicon portion so as to form a silicide, while on the insulator portion the metal remains in a metallic state, which is utilized to selectively form a silicide, and the metal film is selectively removed by an etching process.

When the salicide method was applied to the formation of transistors, it replaced the existing silicide formation method based on the CVD process. Particularly, the process for formation of the transistor includes the process for formation of titanium (Ti) salicide, in which the electrical resistivity of metal and the electrical resistivity of silicide are low.

However, in the conventional Ti salicide process, the silicidizing reaction is achieved through only one round of heat treatment, thereby forming $TiSi_2$. Therefore, due to the stoichiometry in which one Ti atom requires two Si atoms, the junctions of the source and/or drain of the transistor are severely intruded by $TiSi_2$. Further, foreign materials intrude into the interface between the $TiSi_2$ and Al which is used as a wiring layer. Particularly, $TiSi_2$ is oxidized to form $TiO_2$, resulting in an increase of the resistance Rc of the contact. Further, the $TiSi_2$ cannot serve the role of preventing the diffusion of the silicon (Si) atoms and, therefore, the Si atoms pass through the $TiSi_2$ layer to intrude into the Al wire in a melted state. Accordingly, the problems of Al junction spikes (i.e., Al atoms intruding into the Si substrate to form Al spikes) and the electro-migration of the Al wiring (i.e., electron collisions which can cause movement of metal atoms, thereby causing disconnections in metal lines) remain as before.

In an attempt to overcome the problem of the Si atoms passing through the $TiSi_2$ into the Al wiring in a melted form, a technique using contact metallization in the form of Al-TiN-$TiSi_2$ has been developed in which a TiN layer as a diffusion preventing layer is disposed between the Al wiring and the $TiSi_2$ layer.

This technique, however, results in other problems. That is, the TiN layer has to be separately deposited by way of sputtering. Further, as in the conventional Ti salicide process, when the $TiSi_2$ layer is exposed to the external atmosphere, foreign materials intrude to oxidize the $TiSi_2$ layer, thereby forming a natural $TiO_2$. Consequently, the contact resistance Rc of the interface between TiN and $TiSi_2$ may not be improved. That is, the diffusion of the Si atoms into the Al wiring can be prevented, but the problem of the intrusion of foreign materials into the junction of $TiSi_2$ remains as before.

The conventional Ti salicide process will be described referring to FIG. 1.

An active region for forming a unit device and field region 12 for electrically isolating the active regions are formed on p type silicon substrate 11 by applying a LOCOS method. A thermal oxide layer is grown so as to form a gate insulating layer of a transistor, and a polysilicon conductive layer is formed to serve as gate line 13.

A CVD $SiO_2$ layer is deposited on the opposite side walls of gate line 13, and an etch-back is carried out to form CVD $SiO_2$ spacer 14. An impurity implantation is carried out, and self-aligned source/drain region 15 is formed between the gate polysilicon layer with gate side wall spacers and the field oxide layer.

Titanium (Ti) is deposited on the whole surface of the wafer by way of sputtering. A heat treatment is carried out at a temperature of 700°–800° C. under an inert gas atmosphere so that $TiSi_2$ 16 may be selectively formed on the surface of the exposed gate line and on the source/drain region of the Si substrate. During the heat treatment, one Ti atom is bonded with two Si atoms to form $TiSi_2$, and the Si atoms are supplied from the silicon layer or from the polysilicon gate. That is, the metal Ti consumes the exposed silicon in the depthwise direction, thereby forming $TiSi_2$.

The structure is dipped into an ammonia solution to remove the Ti layer remaining after the silicide reaction. A heat treatment is carried out to stabilize the $TiSi_2$ layer, and PSG (phospho-silicate glass) layer 17 is formed on the whole surface of the wafer. A contact hole is formed on the source/drain region, and Al is sputtered so as for it to be diffused. A patterning is carried out to form aluminum wiring 18, thereby completing the formation of the transistor.

There is another salicide technique which is disclosed in U.S. Pat. No. 4,855,798. In this technique, Ti is deposited just after the formation of a gate side wall spacer. A heat treatment is carried out so that the Ti upon the insulating layer may become TiN, the Ti on the surface of the silicon layer may become $TiSi_2$, and a silicide nitride ($TiSi_2N$) may be formed on the $TiSi_2$ layer. After the reaction, the TiN is removed, thereby completing the salicide process. In this technique, the selective etch characteristics of the TiN and the $TiSi_2N$ are degraded, and therefore a short can occur between the gate and the source/drain region after removing the TiN. The $TiSi_2N$ layer which remains on the source/drain region after removal of the TiN is too thin to serve as a diffusion preventing layer. Further, the $TiSi_2N$ layer of the source/drain region after removing the TiN has a stepped shape.

In the above described conventional technique, Ti atoms intrude into the source/drain junction due to the severe consumption of the Si atoms during the formation of the TiSi₂ layer. Therefore, the characteristics of the junction is degraded, and it is impossible to form a thin source/drain junction.

Further, the TiSi₂ layer cannot prevent the diffusion of the Si atoms, and therefore the Si atoms are diffused into the Al wiring. Therefore, the junction is liable to be damaged due to an Al spike, or electro-migration of the Al wiring may occur, thereby deteriorating the reliability of the transistor.

Further, TiSi₂ is easily oxidized upon being exposed to the atmosphere, and therefore when Al has been deposited, foreign materials such as $TiO_2$ are formed in the interface between the Al layer and the TiSi₂ layer. Consequently, the contact resistance Rc is increased, and therefore the operating speed of the transistor slows.

SUMMARY OF THE INVENTION

The present invention is intended to overcome the above described disadvantages of the conventional techniques.

Therefore it is an object of the present invention to provide a process for formation of a semiconductor device in which the problem of the operating speed of the transistor slowing down is solved. That is, the mentioned problem is solved by improving the conventional Ti salicide process in which a silicide is simultaneously formed on the junction surfaces of a gate and a source/drain region. Thus, there are solved the problems such as: high contact resistance Rc due to the intrusion of foreign materials into the interface between an Al layer and a TiSi₂ layer; the degradation of the reliability of the contact due to the incapability of the TiSi₂ layer as a Ti diffusion preventing layer; and the intrusion of the Ti atoms into the junction due to a severe consumption of the Si atoms of the source/drain region during the reaction of the TiSi₂.

That is, the reaction of the silicide is divided into two steps, so that a TiN layer as a diffusion preventing layer may be formed without carrying out the conventional step of forming a separate oxidation preventing layer. Thus the problems which are accompany the formation of the conventional Ti salicide transistor are addressed.

According to the present invention, Ti is deposited on an Si surface, and a heat treatment is carried out at a temperature of about 600°–700° C., which is a temperature level lower than the conventional TiSi₂ formation temperature, so that a TiSi (mono-silicide) may be formed. The TiSi is heat-treated for a long time under a nitrogen atmosphere so that TiN may be formed on the surface, as well as forming TiSi₂. That is,

$$2TiSi + N_2 \rightarrow 2TiN + 2Si \quad (1)$$

$$TiSi + Si \rightarrow TiSi_2 \quad (2)$$

TiN is formed in Formula (1), leaving Si atoms, and the left Si atoms become the supply source of Si for the formation of TiSi₂.

As illustrated in FIGS. 3 and 4, the silicidizing reaction is carried out at a temperature of about 600°–700° C., so that the TiSi phase may be formed at a greater rate than the TiSi₂ phase. Further, in order to form TiN which has a thermodynamically larger growth potential than TiSi, a heat treatment is carried out at a temperature of about 700° C. for a long time under a gas atmosphere containing nitrogen ($N_2$, $NH_3$). Thus, a reaction is induced so as for "Si" to be substituted by "N". A phase transition occurs from TiSi to TiSi₂ as illustrated in FIG. 4. When the phase transition occurs from TiSi to TiSi₂, the Si which has been left in the TiN reaction becomes the Si supply source, so that the consumption of the Si from the Si layer may be minimized.

According to the present invention, when Ti and Si react to form a silicide, TiSi is formed in an intermediate phase other than TiSi₂ (the intermediate phase is a metastable state which appears at an intermediate step when the reaction progresses toward the final phase). Further, one Ti atom requires one Si atom, and therefore the Si consumption on the silicon layer which is contacted with the Ti is reduced to ½ compared with the case where the TiSi₂ is grown directly. At the step for heat-treating the final TiSi₂, nitrogen is supplied, so that a TiN forming reaction may occur on the surface of the TiSi. The Si which is left during the TiN forming reaction is supplied when the TiSi is transited to the TiSi₂ of the final stable phase. As a result, the consumption of the Si atoms which are supplied from the silicon substrate (i.e., the diffusion region and source/drain region) is minimized.

Consequently, even if the TiSi₂ silicide which is same as that of the conventional techniques is formed on a gate poly surface and on a source/drain region of a transistor, the intrusion of the TiSi₂ into the junction can be inhibited. Further, TiN can be formed upon the TiSi₂ layer under a nitrogen atmosphere without adding any separate step, so that the contact of the source/drain region can be made in the form of Al/TiN/TiSi₂.

Thus a diffusion preventing layer (TiN film) is formed between the Al and TiSi₂ layers, with the result that a reliable contact wiring structure is formed.

The conductive layer according to the present invention includes: an impurity region formed upon a semiconductor substrate; a metal silicide layer formed upon the impurity region; a metal silicide nitride layer formed on the metal silicide layer; and a metal nitride layer formed on the metal silicide nitride layer, the above layers being formed in the mentioned order.

The metal used in the present invention may be such that the metal can be bonded with silicon, and the bonded metal compound may form a metastable silicide phase and a final stable silicide phase. For example, if titanium is used, the metal silicide is TiSi₂, and the metal silicide nitride is TiSiN, while the metal nitride is TiN.

The MOSFET according to the present invention includes: a metal silicide layer formed on an impurity region and on the upper face of a gate electrode; a metal silicide nitride layer formed on the metal silicide layer; and a metal nitride layer formed on the metal silicide nitride layer.

The process for formation of a conductive layer according to the present invention includes the steps of: (a) forming an impurity region on a semiconductor substrate; (b) forming a metal layer on the impurity region; (c) carrying out a heat treatment under an inert gas atmosphere so as for the metal and the silicon of the semiconductor substrate to be bonded together, and so as to form a metal silicide of a metastable phase; and (d) carrying out a heat treatment under an nitrogen gas atmosphere so as for the metal silicide of the metastable phase to phase-transit to a stable phase, whereby a conductive layer is formed consisting of the impurity region, the metal silicide layer, the metal silicide nitride layer, and the metal nitride layer, the above layers being stacked in the mentioned order.

The process for formation of a MOSFET on a semiconductor substrate according to the present invention includes the steps of: (a) forming a source, a drain and a gate using a semiconductor silicon, with their upper face being exposed; (b) forming a metal layer on the whole surface; (c) carrying out a heat treatment under an inert gas atmosphere so as for the metal layer and the silicon to be bonded, and so as to form a metal silicide of a metastable phase; and (d)

carrying out a heat treatment under a nitrogen gas atmosphere so as for the metal silicide of a metastable phase to phase-transit to a stable phase.

Here, the metal layer may be formed by sputtering titanium to a thickness of about 1000 Å. At step (c), the heat treatment is carried out at a temperature of about 600°–700° C. for about 20 minutes under an argon or neon gas atmosphere. At step (d), the heat treatment is carried out at a temperature of about 700° C. under an $NH_3$ gas atmosphere. At step (b), a titanium layer is formed on the source, drain and gate electrodes. At step (c), the TiSi layer is formed by carrying out a heat treatment at a temperature of about 600°–700° C. for about 20 minutes under an inert gas atmosphere. At step (d), the TiN layer is formed on the surface of the TiSi layer by carrying out a heat treatment at a temperature of about 700° C. under an $NH_3$ gas atmosphere, the TiSi lying under the TiN layer forms a $TiSi_2$ layer. Alternatively, at step (d), a TiN layer is formed on the surface of the TiSi layer by carrying out a heat treatment at a temperature of about 700° C. under an $NH_3$ gas atmosphere, and the TiSi lying under the TiN layer partly forms $TiSi_2$ and partly forms TiSiN. Thus the semiconductor impurity region, the $TiSi_2$ layer, the TiSiN layer, and the TiN layer are stacked in the cited order.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

The preferred embodiments of the present invention will be described referring to FIG. 2.

Figure 1:
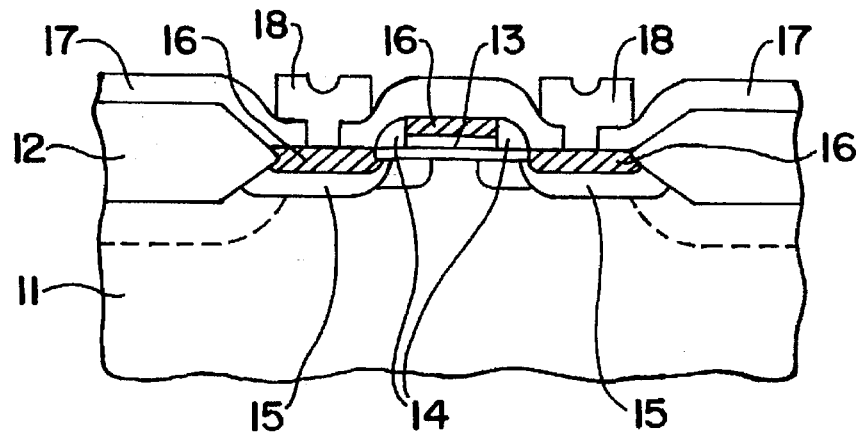
FIG. 1 is a partly sectional view of a MOSFET for showing a conventional process for formation of a semiconductor device.
Figure 2A:
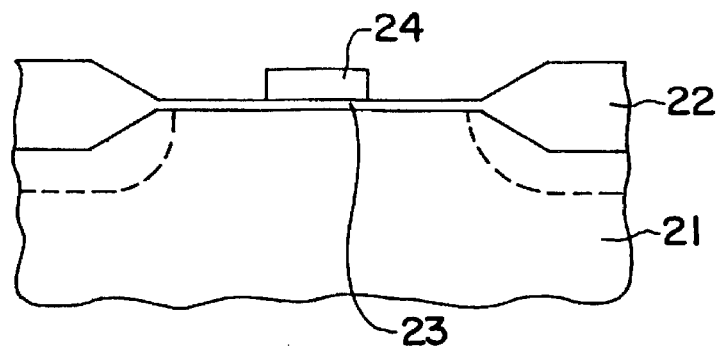
FIG. 2 is a sectional view illustrating the steps of the process for formation of the semiconductor device according to the present invention.

As illustrated in FIG. 2A, a LOCOS process is carried out for separating non-active region 22 and an active region (the region excluding the non-active region) on first conduction type (e.g., p type) Si substrate 21 in the conventional manner. A thermal oxide layer as gate insulating layer 23 is formed to a thickness of about 100 Å on Si substrate 21. A conductive layer which is to be used as gate electrode 24 is formed by depositing polysilicon to a thickness of about 2500 Å by applying an LPCVD (low pressure chemical vapor deposition) method. A photo etching is carried out to pattern gate electrode 24.

Figure 2B:
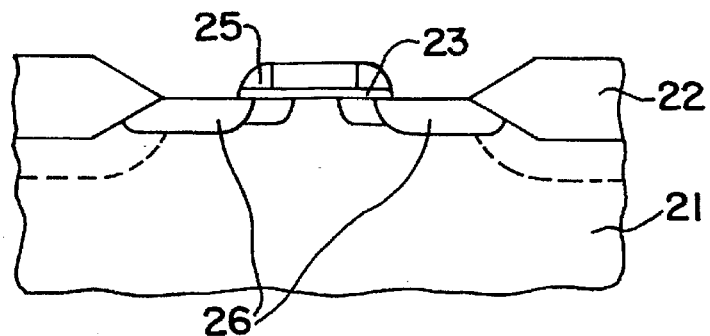

As illustrated in FIG. 2B, a CVD $SiO_2$ is deposited, and the CVD $SiO_2$ is etched back, thereby forming $SiO_2$ spacer 25 on the opposite side walls of gate electrode 24. An ion implantation is carried out to introduce an impurity into the substrate, thereby forming an impurity region for forming a source and drain.

Figure 2C:
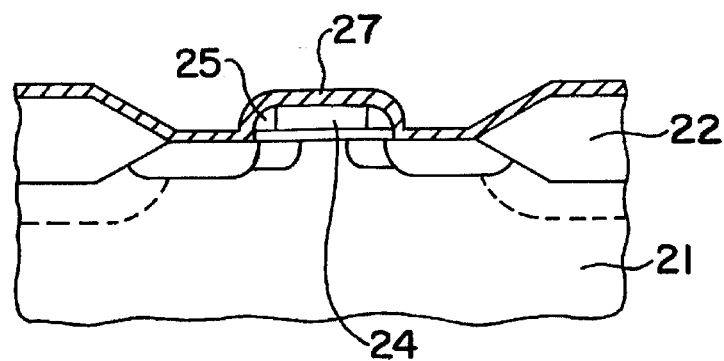

As illustrated in FIG. 2C, titanium (Ti) is sputtered to a thickness of about 1000 Å so as to form titanium layer 27.

Figure 2D:
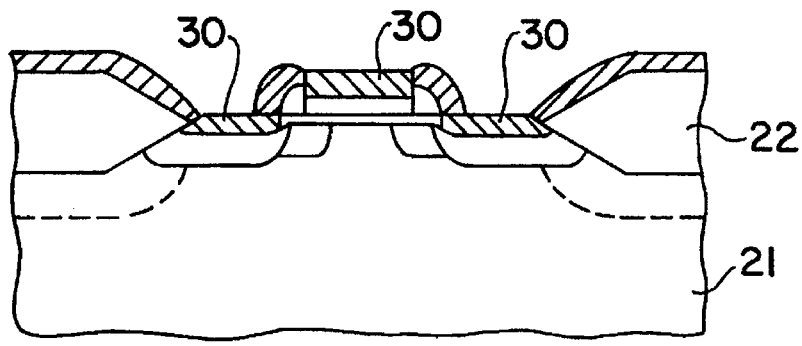

As illustrated in FIG. 2D, a heat treatment is carried out at a temperature of about 600°–700° C. for about 20 minutes under an inert gas (Ar or $N_2$) atmosphere so as to form TiSi mono-silicide layer 30.

Figure 2E:
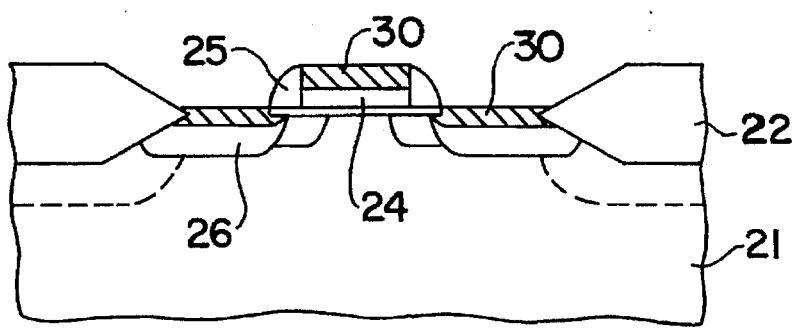

As illustrated in FIG. 2E, the Ti which has not been reacted with the Si is removed by dipping it into liquid ammonia. Thus, only TiSi silicide layer 30 remains on the surfaces of the gate line, source and drain.

Figure 2F:
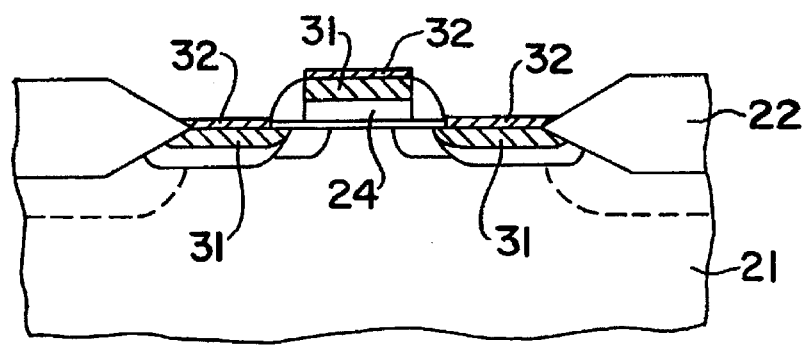

As illustrated in FIG. 2F, a heat treatment is carried out at a temperature of about 700° C. under an $NH_3$ gas atmosphere so as to form TiN layer 32 on the surface of TiSi layer 30. Under this condition, the TiSi which lies on the surface forms $TiSi_2$ layer 31. Under this condition, a thin TiSiN layer can be formed between TiN layer 32 and the $TiSi_2$ layer 31.

In other words, the $TiSi_2$ layer is formed through two steps. That is the two-step silicidation can be expressed as follows.

First step: Ti+Si→TiSi,

Second step: TiSi+N →TiN+Si* TiSi+Si→$TiSi_2$, or alternatively,

TiSi+N→TiN+Si*

TiSi+N→TiSiN

TiSi+Si→$TiSi_2$ where Si* indicates the Si atoms which are separated from the TiSi.

Figure 2G:
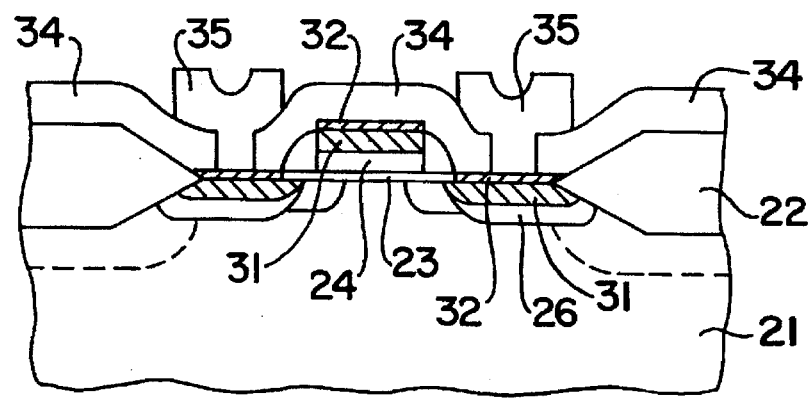

As illustrated in FIG. 2G, CD $SiO_2$ layer 34 is formed on the whole surface of the substrate, and a contact hole is formed to provide a wiring to source/drain region 26. Al is deposited, and a patterning is carried out to form wiring pattern 35.

The subsequent steps are carried out in the conventional manner, thereby completing the semiconductor MOS chip.

Figure 3:
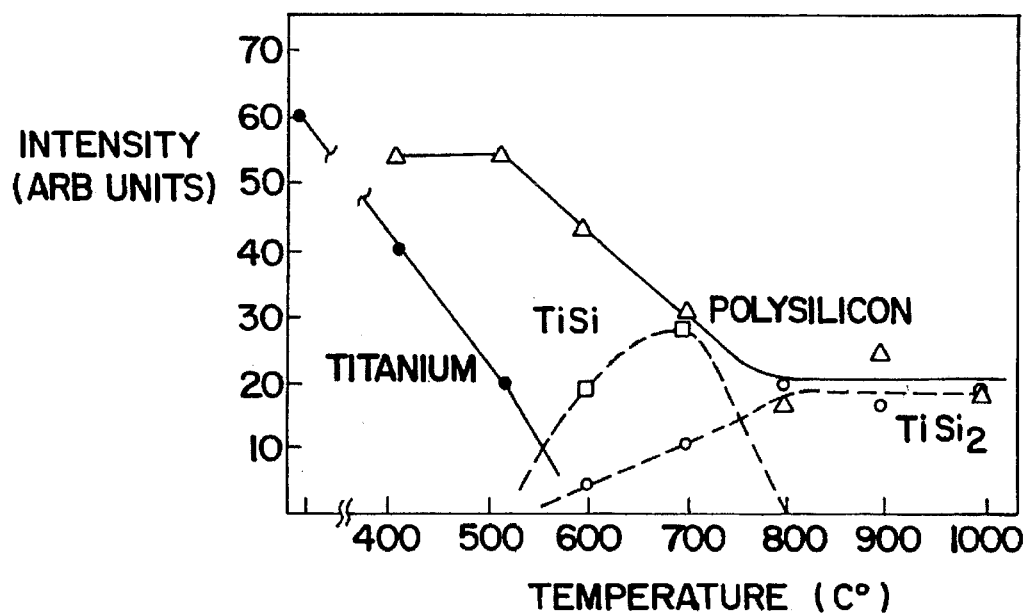
FIG. 3 is a graphical illustration of the variations of the concentration distribution of titanium, polysilicon and the like versus the temperature of the heat treatment.
Figure 4:
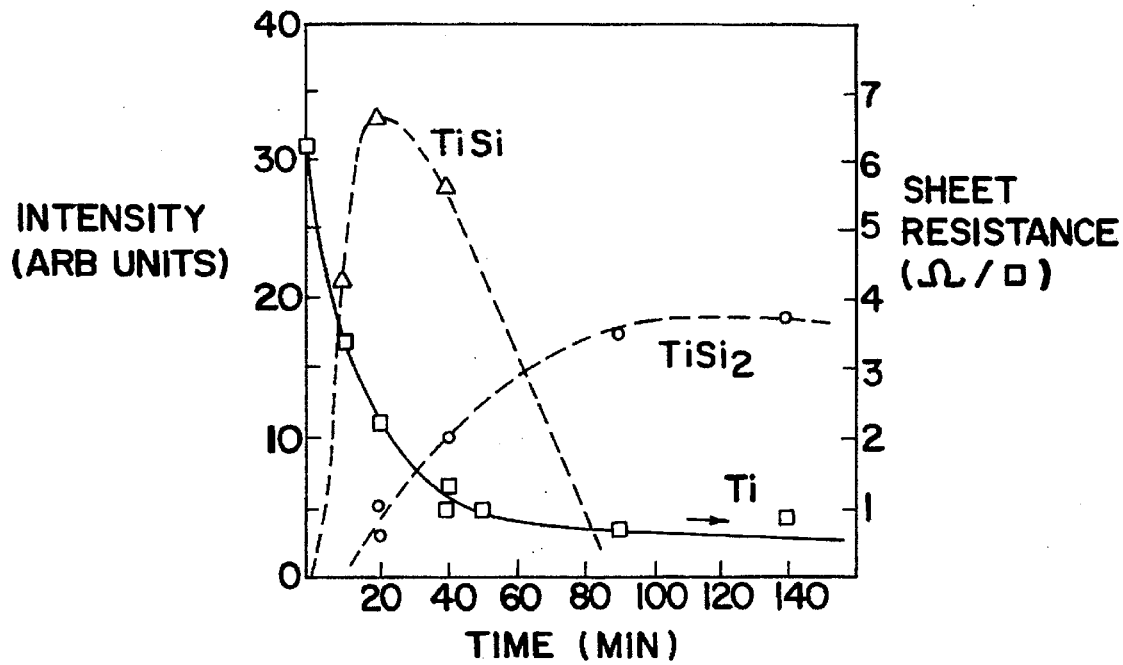
FIG. 4 is graphical illustration of the variations of the concentration distribution of the metastable phase and the final stable phase of the titanium silicide versus the time period of the heat treatment.

FIG. 3 is a graphical illustration of the variations of the concentration distribution of titanium, polysilicon and the like versus the temperature of the heat treatment. FIG. 4 is graphical illustration of the variations of the concentration distribution of the metastable phase and the final stable phase of the titanium silicide versus the time period of the heat treatment. In FIGS. 3 and 4, "ARB Units" refers to x-ray diffraction intensity arbitrary units, which indicate relative values of x-ray intensity, with the larger values indicating a greater relative amount of material. The resistivity of FIG. 4 refers to resistivity of the material per unit sectional area.

In the present invention, the problem of the intrusion of the $TiSi_2$ into the junction is solved by the two-step silicidation method. That is, Ti+Si→TiSi                                             First silicidation, simultaneously, TiSi+N→TiN+Si TiSi+Si→$TiSi_2$                                      Second silicidation.

Owing to the above reactions, the loss of the junction (disappearance of silicon due to the formation of $TiSi_2$) in that Si consumption can be reduced. Therefore, the electrical characteristics of the source/drain junction of the transistor can be improved. Further, the depth of the intrusion of the $TiSi_2$ is very shallow, and therefore a shallow junction can be formed, with the result that short channel effects and the hot carrier characteristics of the transistor are improved.

Further, the TiN layer which is the Si diffusion preventing layer can be formed on the surface of the $TiSi_2$ layer without carrying out a separate process step, and therefore the reliability of the contact and the Al wiring may be improved.

Further, the intrusion of foreign materials into the interface between the $TiSi_2$ and TiN layers may be inhibited, and TiN is positive compared with $TiSi_2$, so that the growth of foreign materials on the interface between the Al and TiN layers may be minimized, thereby improving the contact resistance Rc of the transistor.

Therefore the present invention can be applied to the next generation semiconductor device, whereby the characteristics of transistor can be greatly improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for formation of a conductive layer, comprising the steps of:
   (a) forming an impurity region on a silicon-containing semiconductor substrate;
   (b) forming a metal layer on the impurity region;
   (c) carrying out a first heat treatment under an inert gas atmosphere, wherein the metal and the silicon of the semiconductor substrate bond together to form a metal silicide of a metastable phase; and
   (d) carrying out a second heat treatment under a nitrogen containing atmosphere wherein the metal silicide of the metastable phase phase-transits to a metal silicide layer, a metal silicide nitride layer and a metal nitride layer of a stable phase;
   wherein a conductive layer is formed comprising the impurity region, the metal silicide layer, the metal silicide nitride layer, and the metal nitride layer.

2. The process as claimed in claim 1, wherein:
   the metal silicide layer comprises $TiSi_2$;
   the metal silicide nitride layer comprises TiSiN; and
   the metal nitride layer comprises TiN.

3. The process as claimed in claim 1, wherein:
   the metal layer is formed by a sputtering process;
   the first heat treatment is carried out at a temperature of about 600°–700° C. under an argon or neon gas atmosphere; and
   the second heat treatment is carried out at a temperature of about 700° C. under an $NH_3$ gas atmosphere.

4. The process as claimed in claim 1, wherein:
   a titanium layer is formed on the impurity region;
   the first heat treatment is carried out at a temperature of about 600°–700° C. under an inert gas atmosphere so as to form a TiSi layer; and
   the second heat treatment is carried out at a temperature of about 700° C. under an $NH_3$ gas atmosphere so as to form a TiN layer on the surface of the TiSi layer, wherein the TiSi layer lying under the TiN layer forms a $TiSi_2$ layer;
   wherein a conductive layer is formed in which the semiconductor impurity region, the $TiSi_2$ layer and the TiN layer are stacked in the cited order.

5. The process as claimed in claim 4, wherein:
   the second heat treatment is carried out at a temperature of about 700° C. under an $NH_3$ gas atmosphere so as to form a TiN layer on the surface of the TiSi layer; and
   the TiSi layer lying under the TiN layer is formed partly into TiSiN and partly into $TiSi_2$;
   wherein a conductive layer is formed in which the semiconductor impurity region, the $TiSi_2$ layer, the TiSiN layer and the TiN layer are stacked in the cited order.

6. The process as claimed in claim 4, wherein the titanium layer is formed to a thickness of 1000 Angstroms by a sputtering process.

7. A process for making a MOSFET in a semiconductor substrate, comprising the steps of:
   (a) forming a source, a drain and a gate on a silicon containing substrate, wherein the source, drain and gate have exposed upper surfaces;
   (b) forming a metal layer on the whole surface;
   (c) carrying out a first heat treatment under an inert gas atmosphere wherein the metal layer and the silicon are bonded to form a metal silicide of a metastable phase; and
   (d) carrying out a second heat treatment under a nitrogen containing gas atmosphere wherein the metal silicide of the metastable phase phase-transits to a stable phase; wherein a conductive layer is formed on the source and drain, wherein the conductive layer comprises a metal silicide layer, a metal silicide nitride layer and a metal nitride layer.

8. The process as claimed in claim 7, wherein:
   the metal layer is formed to a thickness of about 1000 Angstroms by a sputtering process;
   the first heat treatment is carried out at a temperature of about 600°–700° C. under an argon or neon gas atmosphere; and
   the second heat treatment is carried out at a temperature of about 700° C. under an $NH_3$ gas atmosphere.

9. The process as claimed in claim 7, wherein:
   a titanium layer is formed on the source, drain and gate;
   the first heat treatment is carried out at a temperature of about 600°–700° C. under an inert gas atmosphere so as to form a TiSi layer; and
   the second heat treatment is carried out at a temperature of about 700° C. under an $NH_3$ gas atmosphere so as to form a TiN layer on the TiSi layer, and the TiSi layer lying under the TiN layer forms a $TiSi_2$ layer.

10. The process as claimed in claim 9, wherein:
    the second heat treatment is carried out at a temperature of about 700° C. under an $NH_3$ gas atmosphere so as to form the TiN layer on the TiSi layer; and
    the TiSi layer lying under the TiN layer is formed partly into TiSiN and partly into $TiSi_2$;
    wherein the conductive layer is formed in which a semiconductor impurity region of the source or drain, the $TiSi_2$ layer, the TiSiN layer and the TiN layer are stacked in the cited order.

11. The process as claimed in claim 9, wherein, the titanium layer is formed in a thickness of about 1000 Angstroms by a sputtering process.

12. The process as claimed in claim 3, wherein, the metal layer is formed by a sputtering process to a thickness of about 1000 Angstroms.

13. The process as claimed in claim 3, wherein, the first heat treatment is conducted for about 20 minutes.

14. The process as claimed in claim 4, wherein, the first heat treatment is conducted for about 20 minutes.

15. The process as claimed in claim 8, wherein, the first heat treatment is conducted for about 20 minutes.

16. The process as claimed in claim 9, wherein, the first heat treatment is conducted for about 20 minutes.

17. A process for formation of a conductive layer, comprising the steps of:

(a) forming an impurity region on a silicon-containing semiconductor substrate;

(b) forming a metal layer on the impurity region;

(c) carrying out a first heat treatment under an inert gas atmosphere, wherein the metal and the silicon of the semiconductor substrate bond together to form a metal silicide of a metastable phase; and (d) carrying out a second heat treatment under a nitrogen containing atmosphere wherein the metal silicide of the metastable phase phase-transits to a metal silicide layer and a metal nitride layer of a stable phase;

wherein a conductive layer is formed comprising the impurity region, the metal silicide layer and the metal nitride layer.

18. The process as claimed in claim 17, wherein:

the metal silicide layer comprises $TiSi_2$; and the metal nitride layer comprises TiN.

19. The process as claimed in claim 18, wherein a metal silicide nitride layer comprising TiSiN is formed between the metal silicide layer and the metal nitride layer.

20. The process as claimed in claim 17, wherein:

the metal layer is formed by a sputtering process;

the first heat treatment is carried out at a temperature of about 600°–700° C. under an argon or neon gas atmosphere; and the second heat treatment is carried out at a temperature of about 700° C. under an $NH_3$ gas atmosphere.

* * * * *